US009161458B2

(12) United States Patent
Miyata

(10) Patent No.: US 9,161,458 B2
(45) Date of Patent: Oct. 13, 2015

(54) LIGHT EMITTING DEVICE AND MANUFACTURING METHOD THEREOF

(71) Applicant: NICHIA CORPORATION, Tokushima (JP)

(72) Inventor: Tadaaki Miyata, Yokohama (JP)

(73) Assignee: NICHIA CORPORATION, Anan-Shi (JP)

( * ) Notice: Subject to any disclaimer, the term of this patent is extended or adjusted under 35 U.S.C. 154(b) by 132 days.

(21) Appl. No.: 14/135,625

(22) Filed: Dec. 20, 2013

(65) Prior Publication Data

US 2014/0177220 A1 Jun. 26, 2014

(30) Foreign Application Priority Data

Dec. 22, 2012 (JP) ................. 2012-280351

(51) Int. Cl.
| | | |
|---|---|---|
| *F21V 1/00* | (2006.01) | |
| *H05K 3/32* | (2006.01) | |
| *H05K 1/18* | (2006.01) | |
| *H05K 3/22* | (2006.01) | |
| *H01L 25/075* | (2006.01) | |
| *H01L 33/62* | (2010.01) | |
| *H05K 1/14* | (2006.01) | |

(52) U.S. Cl.
CPC ................. *H05K 3/32* (2013.01); *H05K 1/181* (2013.01); *H05K 3/225* (2013.01); *H01L 25/0753* (2013.01); *H01L 33/62* (2013.01); *H01L 2224/16225* (2013.01); *H05K 1/141* (2013.01); *H05K 2201/049* (2013.01); *H05K 2201/10106* (2013.01); *H05K 2203/176* (2013.01); *Y10T 29/49139* (2015.01)

(58) Field of Classification Search
CPC .................. H05K 2203/176; H05K 2201/048; H05K 2201/049; H05K 3/225; H05K 3/32
USPC ........ 362/249.02, 235; 257/88, 81, 89; 438/4, 438/12, 15
See application file for complete search history.

(56) References Cited

U.S. PATENT DOCUMENTS

| | | | |
|---|---|---|---|
| 6,371,637 B1* | 4/2002 | Atchinson et al. ............ 362/555 |
| 6,861,290 B1* | 3/2005 | Moden ......................... 438/118 |
| 7,909,482 B2* | 3/2011 | Veenstra et al. ......... 362/249.05 |
| 8,022,431 B2* | 9/2011 | Kaneko et al. .................. 257/99 |
| 8,596,820 B2* | 12/2013 | Fukasawa et al. ....... 362/249.02 |
| 2002/0149933 A1* | 10/2002 | Archer et al. ................. 362/234 |
| 2005/0247944 A1 | 11/2005 | Haque et al. |
| 2006/0138436 A1* | 6/2006 | Chen et al. ...................... 257/98 |
| 2010/0117537 A1* | 5/2010 | Horppu et al. .................. 315/76 |
| 2010/0226126 A1* | 9/2010 | Naito et al. .................... 362/235 |
| 2011/0037091 A1* | 2/2011 | Fushimi .......................... 257/98 |
| 2011/0058372 A1* | 3/2011 | Lerman et al. ................ 362/235 |
| 2011/0273904 A1* | 11/2011 | Tajiri et al. .................... 362/606 |
| 2011/0309529 A1* | 12/2011 | Kim et al. ...................... 257/783 |
| 2012/0212957 A1* | 8/2012 | Hyun et al. .................... 362/241 |

FOREIGN PATENT DOCUMENTS

| | | |
|---|---|---|
| JP | 2002-76068 A | 3/2002 |
| JP | 2005-322937 A | 11/2005 |
| JP | 2007-150233 A | 6/2007 |

* cited by examiner

*Primary Examiner* — Ali Alavi
(74) *Attorney, Agent, or Firm* — Foley & Lardner LLP

(57) ABSTRACT

A light-emitting device includes a first substrate having a through-hole, a plurality of first light-emitting elements that are arranged on the first substrate, a second substrate that is attached to the first substrate to cover the through-hole of the first substrate, and a second light-emitting element arranged on the second substrate, and electrically connected to wiring of the first substrate.

18 Claims, 7 Drawing Sheets

LIGHT EMITTING DEVICE AND MANUFACTURING METHOD THEREOF

BACKGROUND OF THE INVENTION

1. Field of the Invention

The present disclosure relates to a light-emitting device and a manufacturing method thereof.

2. Description of the Related Art

Conventionally, light-emitting devices in which a plurality of light-emitting elements are mounted on a substrate have been proposed (refer to Japanese Patent Application Publication No. 2005-322937).

The conventional light-emitting device, however, has to be scraped in a case that one of the plurality of light-emitting elements is defective.

SUMMARY OF THE INVENTION

In an embodiment, a light-emitting device comprises: a first substrate having a through-hole; a plurality of first light-emitting elements that are arranged on the first substrate; a second substrate that is attached to the first substrate to cover the through-hole of the first substrate; and a second light-emitting element arranged on the second substrate, and electrically connected to wiring of the first substrate.

BRIEF DESCRIPTION OF THE DRAWINGS

FIG. 1A is a perspective-view and FIG. 1B is a cross-section A-A in FIG. 1A;

FIG. 2A is a schematic plan-view of a second substrate 6 and FIG. 2B is a schematic partial plan-view of a first substrate 4;

FIGS. 3A to 3L are diagrams illustrating a first to seventh process steps of a method for manufacturing a light-emitting device according to an embodiment, in which FIGS. 3A, 3C, 3E, 3G, 3I and 3K are plan views and FIGS. 3B, 3D, 3F, 3H, 3J and 3L are cross-sectional views along cross-sections A-A of their corresponding plan view and a cross-section A-A in FIG. 3A;

DETAILED DESCRIPTION

Hereinafter, embodiments will be described with reference to the accompanying drawings.

Figure 1A:
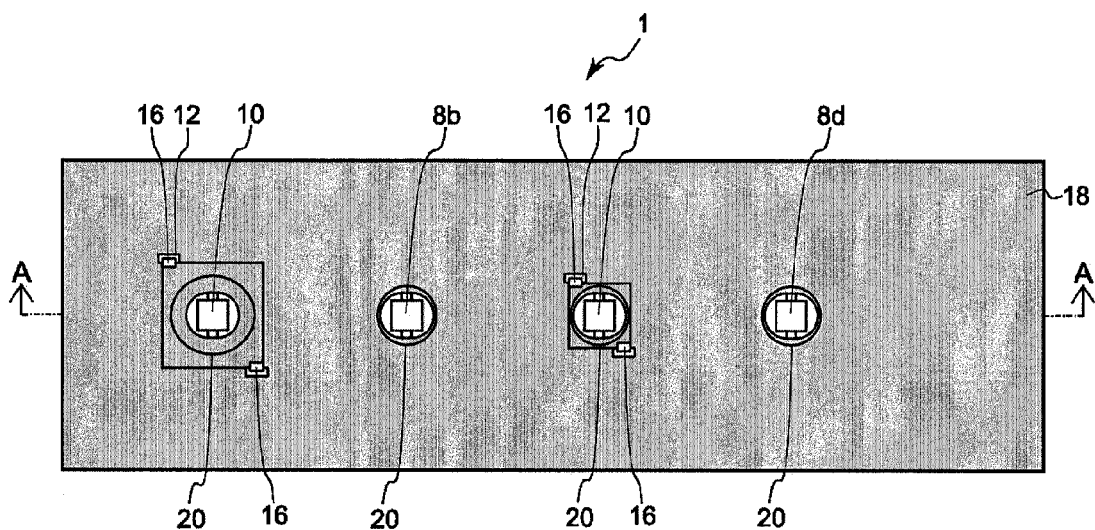
FIGS. 1A and 1B are diagrams illustrating the schematic configuration of a light-emitting device according to an embodiment.
Figure 1B:
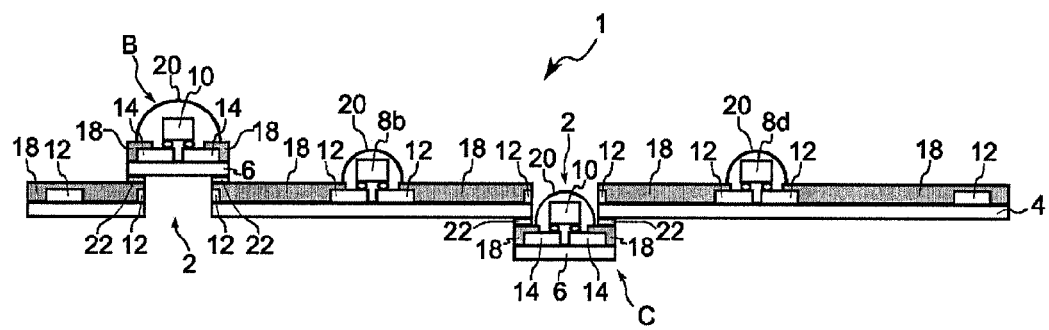

FIGS. 1A and 1B are diagrams illustrating the schematic configuration of a light-emitting device according to an embodiment. FIG. 1A is a perspective-view and FIG. 1B is a cross-section A-A in FIG. 1A.

As illustrated in FIGS. 1A and 1B, a light-emitting device 1 according to the embodiment comprises a first substrate 4 having through-holes 2, a plurality of first light-emitting elements 8 that is arranged on the first substrate 4, second substrates 6 that are attached to the first substrate 4 to cover the through-holes 2 of the first substrate 4, and second light-emitting elements 10 that are arranged on the second substrates 6 and that are electrically connected to wiring 12 of the first substrate 4.

In the embodiment, the regions of the first substrate 4 at which defective elements are arranged are removed from the first substrate 4, and the through-holes 2 of the first substrate 4, which are formed by the removing, are covered with the second substrates 6. The second substrates 6 are substrates different from the first substrates 4.

The defective elements arranged on the first substrate 4 are replaced by second light-emitting elements 10 that are arranged on the second substrates 6, and it becomes possible to use the light-emitting device 1 that were conventionally scrapped.

In the light-emitting device 1 according to the embodiment, new light-emitting elements (second light-emitting elements 10) are arranged at as the same regions of the first substrate 4 as the defective elements were arranged. Therefore, the second light-emitting elements 10 are arranged according to the same arrangement pattern as the first light-emitting elements 8, as if they are the first light-emitting elements 8. Thus, the arrangement pattern of the light-emitting elements before the element replacements is maintained after the element replacements.

When the through-holes 2 of the first substrate 4 are covered by the second substrates 6, the through-holes 2 of the first substrate 4 may be covered directly by the second substrates 6 themselves (direct covering, denoted by B in FIG. 1B) or covered by other members that are provided on the second substrates 6 such as reflective members 18 or the like (indirect covering, denoted by C in FIG. 1B).

Members of the light-emitting device 1 according to the embodiment will be described below.

[First Substrate, Second Substrate]

(Materials)

The material of the first substrate 4 and the second substrates 6 can be appropriately selected by taking into consideration such as mountability of the first light-emitting elements 8 and the second light-emitting elements 10, light reflectance, and bondability with other members.

For example, when the first light-emitting elements 8 and the second light-emitting elements 10 are mounted on the wirings 12, 14 by using solder, it is preferable that materials whose heat resistance are high and from which one or more regions are easily removed are used as the first substrate 4 and the second substrates 6. In particular, thin materials such as polyimides are preferably used as the first substrate 4 and the second substrates 6.

A member such as an elongate tape-like copper foil or aluminum foil that is covered with an insulating member may be used as the first substrate 4 or the second substrates 6. An insulating resin such as polyethylene terephthalate, polyimide or the like is an example of the insulating member.

However, insulating members are more preferably used as the first substrate 4 and the second substrates 6 than conductive members that are covered with insulating members. This is because: when a region of the first substrate 4 is removed from the first substrate 4, something like a conductive debris is formed and it sometimes flies into the surrounding area and the first light-emitting elements 8 mounted in the area become defective. However, when the insulating members are used as the first substrate 4 and the second substrates 6, the conductive debris is prevented from being formed more than when conductive members covered with insulating members are used as the first substrate 4 and the second substrates 6, and the first light-emitting elements 8 are prevented from being defective, therefore, it becomes possible to use the light-emitting device 1 that were conventionally scrapped. Substrates whose base bodies having thin film-like resin or metal may be also used as the first substrate 4 and the second substrates 6. In this case, it becomes easier to produce the light-emitting device 1 according to a roll-to-roll method because the first substrate 4 and the second substrates 6 become thinner and more flexible.

The materials of the first substrate 4 and the second substrates 6 may be different. However, when the same materials are used, the physical properties such as the coefficient of thermal expansions become the same, and the strain in the attachment sections caused by the temperature change are prevented.

(Thickness)

The thickness of the first substrate 4 is not limited. When the thickness of the first substrate 4 is set to range from about 10 µm to 200 µm, the light-emitting device 1 can be produced easily according to a roll-to-roll method. When the second substrates 6 are attached to the top face of the first substrate 4, it is preferable to make the thickness of the second substrates 6 smaller than the thickness of the first substrate 4 by using a film-like substrate. In this case, the height of the first light-emitting elements 8 becomes closer to the height of the second light-emitting elements 10, and changes in the optical characteristics are prevented.

It is also preferable that the second substrates 6 are thinner than the height of the first light-emitting elements 8 or the height of the sealing members 20 that seal the first light-emitting elements 8. In this case, the height of the first light-emitting elements 8 becomes closer to the height of the second light-emitting elements 10 too, and changes in the optical characteristics are prevented.

(Shape, Size of the Area)

The shapes and size of the areas of the first substrate 4 and the second substrates 6 are not limited. Quadrangular and circular are examples of the shape. However, the shape and size of the area of the second substrates 6 should be ones that enable to cover the through-holes 2 formed in the first substrate 4. When the second substrates 6 are attached to the lower face of the first substrate 4, it is preferable that the wiring 14 of the second substrates is smaller than the outline of the second substrates 6, i.e. the edge of the wiring 14 in the second substrates 6 is inside of the edge of the second substrates 6. In this case, the wiring 14 does not reach the edge of the second substrates 6, and the insulation between the exterior of the light-emitting device 1 and the wiring 12 is easily obtained.

When the second substrates 6 are attached to the lower face of the first substrate 4 as illustrated in FIG. 1B, it is preferable that the thickness of the first substrate 4 is thinner than the height of the second light-emitting elements 10 or the height of the sealing members 20 that seal the second light-emitting elements 10. In this case, the second light-emitting elements 10 or the sealing members 20 that seal the second light-emitting elements 10 is provided to protrude at the through-holes 2 from the top face of the first substrate 4, and changes of the optical characteristics is further prevented. Moreover, it is preferable that the through-holes 2 are larger than the second light-emitting elements 10 or the sealing members 20 that seal the second light-emitting elements 10 as illustrated in FIGS. 1A and 1B. In this case, the second light-emitting elements 10 or the sealing members 20 that seal the second light-emitting elements 10 is provided to protrude at the through-holes 2 from the top face of the first substrate 4, and the optical characteristics change is further prevented.

When the second substrates 6 are attached to the lower face of the first substrate 4 on which the below-described reflective member 18 is provided, the second light-emitting elements 10 or the sealing members 20 that seal the second light-emitting elements 10 can be provided not to protrude from the reflective member 18 that is provided on the first substrate 4 (C in FIG. 1B) or to protrude from the reflective member 18 that is provided on the first substrate 4. When the sealing members 20 protrude, changes of the optical characteristics is prevented more than when the sealing member 20 does not protrude, therefore it is preferable that the sum of the total thickness of the reflective member 18 and the first substrate 4 is smaller than the height of the second light-emitting elements 10 or of the sealing members 20 that seal the second light-emitting elements 10.

Preferably, the through-holes 2 are covered by the second substrates 6 as no gap is left (i.e. are covered as no run-through portions are left). In this case, the drop in reflectance of the first substrate 4 derived from the formation of the through-holes 2 is compensated (light cannot be reflected at sites where the through-holes 2 are formed).

(Protruding Sections)

Figure 2A:
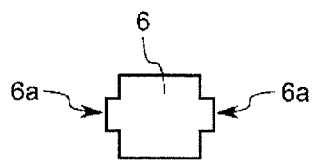
FIGS. 2A and 2B are diagrams for explaining protruding sections according to an embodiment.
Figure 2B:
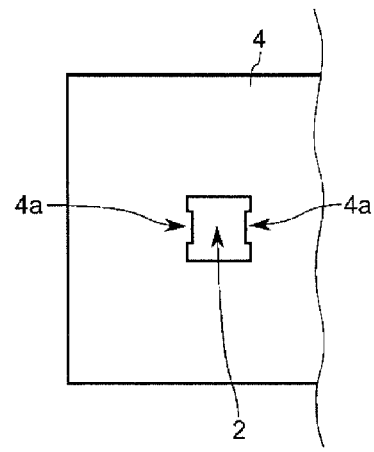

FIGS. 2A and 2B are diagrams for explaining protruding sections according to the embodiment, where FIG. 2A is a schematic plan-view of the second substrates 6 and FIG. 2B is a schematic partial plan-view of the first substrate 4.

As illustrated in FIG. 2A, it is preferable that each second substrate 6 comprises protruding sections 6a in which parts of the second substrate 6 protrude beyond the periphery of the rest of the second substrate. In this case, the second substrate 6 are easily attached to the first substrate 4 by providing an adhesive member such as an adhesive on the protruding sections 6a, and it becomes even more possible to use the light-emitting device 1 that were conventionally scrapped.

As illustrated in FIG. 2B, protruding sections 4a may be provided on the first substrate 4. Those protruding sections 4a can be formed, for instance, at the time where the through-holes 2 are formed. The second substrates 6 are easily attached to the first substrate 4 with the protruding sections 4a of the first substrate 4 as well as with the protruding sections 6a of the second substrates 6, and it becomes even more possible to use the light-emitting device 1 that were conventionally scrapped.

(Through-Holes 2)

The shapes and size of the opening areas of the through-holes 2 are not limited, but are preferably set by taking into consideration such as the pattern of the wiring 12 on the first substrate 4 and whether the through-holes 2 can be readily covered by the second substrates 6 or not.

A rectangular shape that is similar to the shape of the second substrates 6 and whose seize of the area is smaller than that of the second substrates 6 is an example of the shapes and size of the opening areas in which the above considerations have been factored. In this case, an adhesive member 22 such as an adhesive can be provided to surround the through-holes 2 at a region on the second substrates 6, and the second substrates 6 are easily attached.

The method for forming the through-holes 2 is selected from various methods, depending on the properties of the first substrate 4 such as whether the first substrate 4 is broken or deformed by the load added when the through-holes 2 are formed. Punched and cut out are examples of the method of the through-holes 2.

(Positional Relationship Between the First Substrate 4 and the Second Substrates 6)

The second substrates 6 may be attached to the top face of the first substrate 4 (location denoted by reference symbol B in FIG. 1B), or may be attached to the lower face of the first substrate 4 (location denoted by reference symbol C in FIG. 1B). In the case where the second substrates 6 are attached to the top face, the second substrates 6 do not protrude from the lower face side of the light-emitting device 1. Therefore, handling of the light-emitting device 1 becomes easier, and mounting of the light-emitting device 1 (for instance, fixing to an illumination device) becomes easier. On the other hand, in the case where the second substrates 6 are attached to the lower face, the wiring 12 that is bared at the edges of the through-holes 2 can be easily covered with the reflective member 18, and the insulation between the wiring 12 and the exterior of the light-emitting device 1 is easily achieved.

In the case that the second substrates 6 are attached to the top face of the first substrate 4, parts of the second substrates 6 (for example, the abovementioned protruding sections) can bend inside the through-holes 2, extend towards the lower face of the first substrate 4, and be attached to the lower face of the first substrate 4 (the portions of the second substrates 6 at which the second light-emitting elements 10 are arranged are positioned on the top face of the first substrate 4). In this case, it is preferable that the second substrates 6 are flexible from a viewpoint of easily achieving the insulation between the wiring 12 and the exterior of the light-emitting device 1.

In a case that the second substrates 6 are attached to the lower face of the first substrate 4, parts of the second substrates 6 (for instance, the protruding sections) can bend inside the through-holes 2, extend towards the top face of the first substrate 4, and be attached to the top face of the first substrate 4 (the portions on the second substrates 6 at which the second light-emitting elements 10 are arranged are positioned on the lower face of the first substrate 4). In this a case, it is also preferable that the second substrates 6 are flexible.

In this specification, the top face of the first substrate 4 denotes the face where the first light-emitting elements 8 are mounted, which is one of main faces of the first substrate 4, and the lower face denotes the opposite face of it.

As illustrated in FIGS. 1A and 1B, the second substrates 6 may be attached to the top face and the lower face of the first substrate 4, respectively. That is, as illustrated in FIG. 1B, the second substrates 6 may be attached to the top face of the first substrate 4, may be attached to the lower face of the first substrate 4, or may be attached to top face and the lower face of the first substrate 4.

Various methods such as bonding by an insulating adhesive, bonding by a conductive adhesive, joining by solder, thermo-compression bonding, fitting between the first substrate 4 and the second substrates 6, and any combination of these methods are examples of the method of attaching the second substrates 6 to the first substrate 4.

[Reflective Member 18]

The reflective member 18 may be provided on the first substrate 4. In this case, the reflectance of the first substrate 4 is enhanced. In particular, the reflectance of the first substrate 4 is even more enhanced with covering of at least one part of the wiring 12 with the reflective member 18.

The reflective member 18 may be provided also on the second substrates 6. In this case, the reflectance at the regions of the first substrate 4 at which the through-holes 2 are formed is compensated.

It is preferable that the reflective member 18 covers the first substrate 4 and the second substrates 6 continuously. In this case, the level differences from the first substrate 4 to the second substrates 6 become smoothed out with the covering.

It is preferable that viscosity/thixotropy before curing of the reflective member 18, which is provided as to cover the first substrate 4 and the second substrates 6, are high. From this perspective, it is preferable that the reflective member 18 contains a viscosity modifier such as $SiO_2$ microparticles or the like. In this case, the reflective member 18 is easily arranged between the first substrate 4 and the second substrates 6, and the level differences from the first substrate 4 to the second substrates 6 is easily smoothed out.

(Materials)

A white resin or white resist that contain an epoxy resin, a silicone resin, or a modified resin mixed with $SiO_2$, $Al_2O_3$, $Ba_3O_4$, $TiO_2$ or the like is used as the reflective member 18.

Preferably, a resin that is harder than that of the first substrate 4 (When a polyimide is used in the first substrate 4, an epoxy resin in an example.) is used as the reflective member 18 that is provided on the first substrate 4. In this case, when the regions of the first substrate 4 are punched together with the reflective member 18, the through-holes 2 are formed precisely.

When the reflective member 18 has insulating property and covers continuously from the first substrate 4 to the second substrates 6, the edges of the wiring 12 of the first substrate 4 that become exposed after the removing are covered and protected (Method for Providing the Reflective Member)

The reflective member 18 can be provided in accordance with a method such as printing, coating, spin coating, spray coating or the like.

[First Light-Emitting Elements, Second Light-Emitting Elements]

Various light-emitting diodes such as surface mounted-type LEDs, LED chips, chip-size package LEDs or the like may be used as the first light-emitting elements 8 and the second light-emitting elements 10. If these elements are used, the first light-emitting elements 8 and the second light-emitting elements 10 are electrically connected to the wiring pattern 4 in accordance with various methods by using various joining members (for example, flip-chip mounting by bumps and solder, or wire bonding mounting by wires). When LED chips are used as the first light-emitting elements 8 and the second light-emitting elements 10, it is possible to reduce costs in particular.

The second light-emitting elements 10 are electrically connected to the wiring 12 of the first substrate 4. More specifically, the second light-emitting elements 10 in the embodiment are connected, in accordance with a flip-chip scheme, to the wiring 14 of the second substrates 6. The wiring 14 of the second substrates 6 is connected to the wiring 12 of the first substrate 4 with connection members 16 such as a solder, and the second light-emitting elements 10 are electrically connected to the wiring 12 of the first substrate 4. In the embodiment, the first light-emitting elements 8 are connected to the wiring 12 of the first substrate 4 in accordance with a flip-flip-chip scheme.

The above configuration is merely an example, and the first light-emitting elements 8 may be connected to the wiring 12 of the first substrate 4 by, for example, die bonding or wire bonding. For example, the second light-emitting elements 10 may be connected to the wiring 12 of the first substrate 4 by wire bonding or the like, and the second light-emitting elements 10 are electrically connected to the wiring 12 of the first substrate 4. The wiring 14 of the second substrates 6 may be connected to the wiring 12 of the first substrate 4, for example, by way of a conductive adhesive or the like.

In this specification, defective elements denote light-emitting elements having undesirable characteristics for use in a light-emitting device. Light-emitting elements that have abnormal voltage, abnormal luminosity, abnormal emission wavelength or the like is an example as the defective elements. Undesirable characteristics include, for example, characteristics caused by the sealing members 20 such as abnormal light distribution, and color unevenness or color variability caused by the wavelength conversion member.

[Wiring]

A metal such as copper or aluminum may be used in the wirings 12, 14. A material having low malleability is preferably used in the wiring 12 that is provided on the first substrate 4 (in the above example, specifically, aluminum is preferably used, rather than copper). This is because: In a case that a material of high malleability is used, the wiring 12 may extend from the top face of the first substrate 4 up to the lower face of the first substrate 4 through the through-holes 2 when the through-holes 2 are formed in the first substrate 4 by punching, and the insulation between the top face and the lower face of the first substrate 4 may not be achieved. A different material of higher malleability than that of the material of low malleability may be provided by plating or the like on the surface of the low-malleability material. In this case, both of the insulation and the characteristics required to the wiring (for example, die bondability and light reflectance) are achieved.

Preferably, the wirings 12, 14 are provided over as large an area as possible on the surface of the first substrate 4 and the second substrates 6. In this way, heat dissipation is enhanced.

[Sealing Member]

Preferably, the first light-emitting elements 8 and the second light-emitting elements 10 are sealed by the sealing members 20.

A light-transmitting resin (for example, an epoxy resin, a urea resin, a silicone resin or modified types thereof) is preferably used in the sealing members 20.

Preferably, the sealing members 20 comprise a wavelength conversion member such as phosphors, quantum dots and the like, a light diffusion member diffusing light and/or the like.

For example, a phosphor such as an oxide-based, sulfide-based or nitride-based phosphor can be used as the wavelength conversion member. When a gallium nitride-based light-emitting element that emits blue light is used in the light-emitting elements, it is preferable to use, singly or in combination, a YAG-based or LAG-based phosphor that absorbs blue light and emits yellow to green light, a SiAlON-based phosphor that absorbs blue light and emits green light, or a SCASN-based or CASN-based phosphor that absorbs blue light and emits red light.

In particular, a combination of a SiAlON-based phosphor and a SCASN phosphor is preferably used as the wavelength conversion member, in a light-emitting device that is used in a display device such as a liquid crystal display or a backlight of a television set. A combination of a YAG-based or LAG-based phosphor and a SCASN-based or CASN-based phosphor is preferably used as the wavelength conversion member in a light-emitting device for illumination applications.

For example, $SiO_2$, $Al_2O_2$ or $BaSO_4$ can be used as a light scattering member.

The abovementioned wavelength conversion member and light scattering member can be included in a member different from the sealing members 20. Members provided at a distance from the sealing members 20 in the light-emitting device 1 and members that are provided separately from the light-emitting device 1 (for example, covers, sheets and the like that are ancillary to an illumination device or a liquid crystal display) are examples of those different members.

In the embodiment, an example has been illustrated wherein the light-emitting elements 8, 10 are each sealed by one respective sealing member 20. However, two or more light-emitting elements can be sealed collectively by one sealing member.

[Underfill]

Preferably, an underfill is provided between the first light-emitting elements 8 and the first substrate 4 and/or between the second light-emitting elements 10 and the second substrates 6 in a case that the first light-emitting elements 8 and the second light-emitting elements 10 are flip-chip mounted.

A silicone resin, an epoxy resin or a modified type thereof can be used as the underfill, for example.

Preferably, the underfill has light reflectivity, and, specifically, contains white $TiO_2$, $SiO_2$ or the like. In this case, the light extraction efficiency of the light-emitting device 1 can be enhanced.

[Manufacturing Method]

FIGS. 3A to 3L are diagrams illustrating schematic process steps of a method for manufacturing a light-emitting device according to the embodiment. In the figures, FIGS. 3A, 3C, 3E, 3G, 3I and 3K are plan-views, and FIGS. 3B, 3D, 3F, 3H, 3J and 3L are cross-section views along cross sections A-A of the corresponding plan view.

(First Process Step)

Figure 3A:
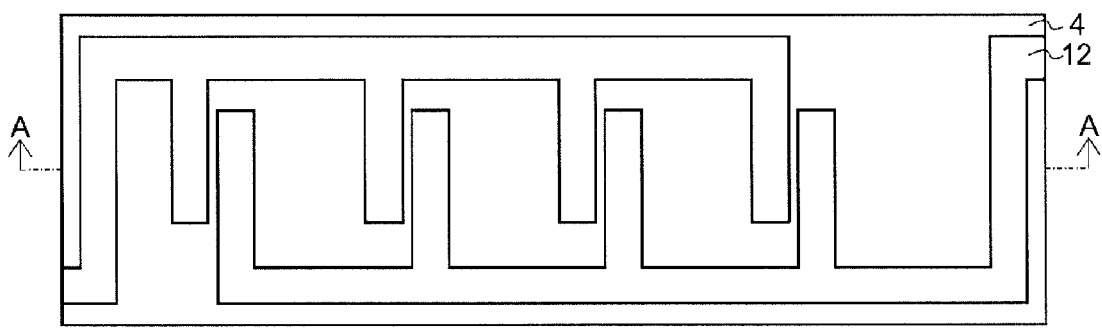
Figure 3B:
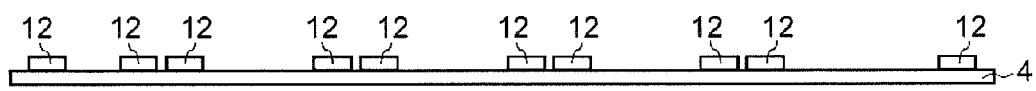

The first substrate 4 provided with the wiring 12 is prepared first, as illustrated in FIGS. 3A and 3B.

(Second Process Step)

Figure 3C:
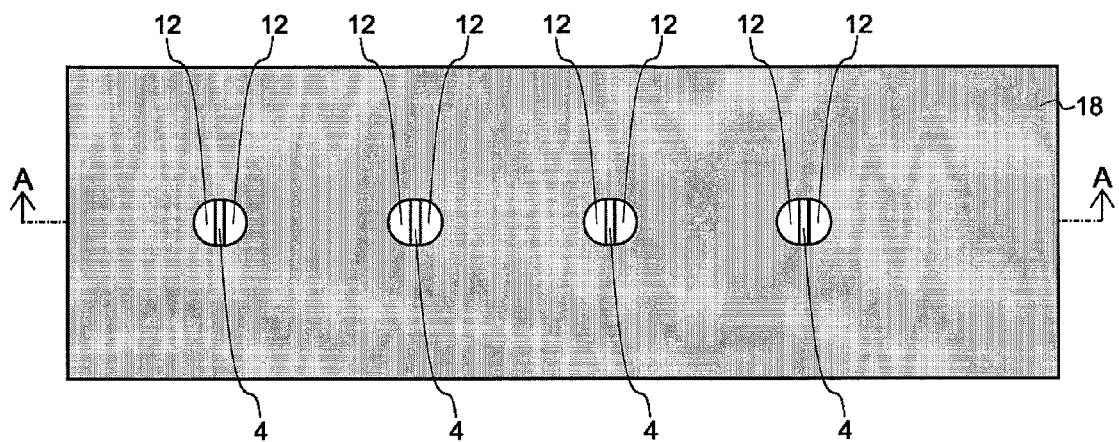
Figure 3D:
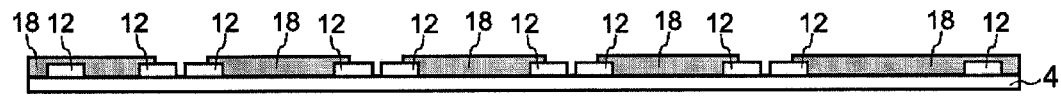

Next, the reflective member 18 is provided on the first substrate 4, as illustrated in FIGS. 3C and 3D. Openings (portions where the reflective member 18 is not provided) are provided at several locations in the first substrate 4, and parts of the wiring 12 becomes exposed.

The reflective member 18 on the first substrate 4 may be provided after removing in a below-described fifth process step. However, it is preferable that the reflective member 18 on the first substrate 4 is provided before the removing in the fifth process step.

In this case, the first substrate 4 is reinforced by the reflective member 18 that has a decent hardness and thickness, and it becomes possible to remove the regions of the first substrate 4 with the reflective member 18. Thus, the regions of the first substrate 4 is easily removed (FIGS. 3G and 3H).

Therefore, the through-holes 2 can be formed in the first substrate 4 with less damage (for example, breakage, bending of the first substrate 4) even in a case that a small force adds a substantial load to the substrate (for example, even in a case that a flexible band-like substrate is used as the first substrate 4).

(Third Process Step)

Figure 3E:
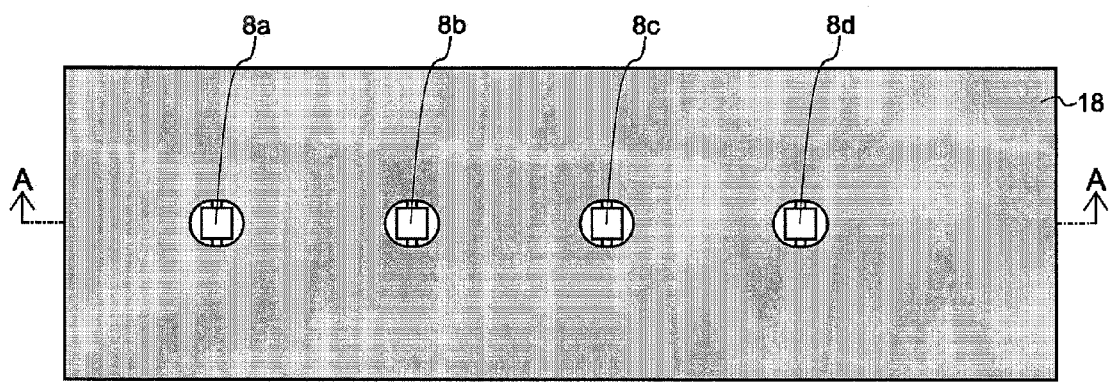
Figure 3F:
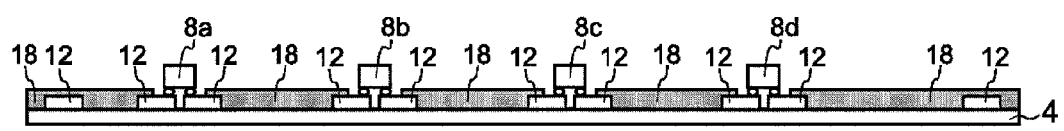
Figure 3G:
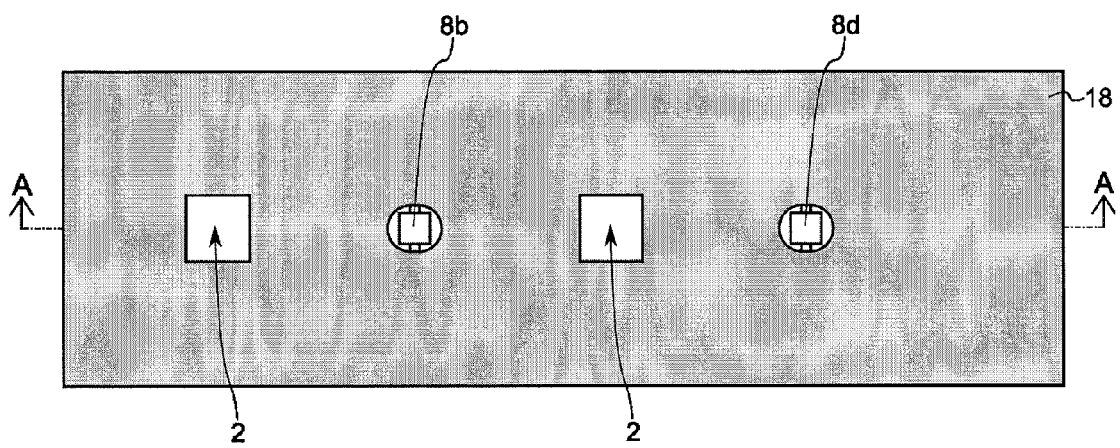
Figure 3H:
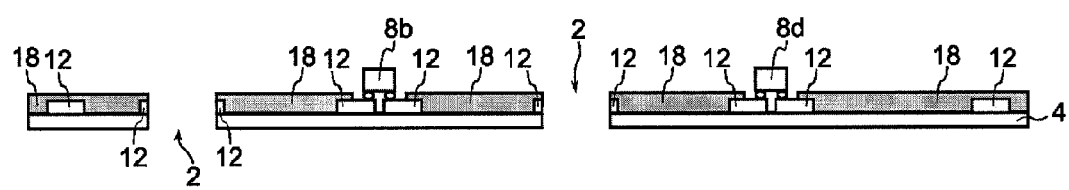

Next, as illustrated in FIGS. 3E and 3F, a plurality of first light-emitting elements 8a, 8b, 8c, 8d are arranged on the exposed wiring, and the light-emitting elements 8a, 8b, 8c, 8d are connected to the wiring 12.

(Fourth Process Step)

Next, the plurality of first light-emitting elements 8a, 8b, 8c, 8d shown in FIGS. 3E and 3F are determined to be good or bad (defective).

(Fifth Process Step)

Next, as illustrated in FIGS. 3G and 3H, the through-holes 2 are formed in the first substrate 4 by removing (for example, punching, cut-out) from the first substrate 4 the regions of the first substrate 4 at which defective elements are arranged. Herein, it is assumed that the light-emitting elements 8a, 8c are defective elements among the plurality of light-emitting elements 8a, 8b, 8c, 8d. As described above, the regions of the first substrate 4 are removed with the reflective member 18.

(Sixth Process Step)

Figure 3I:
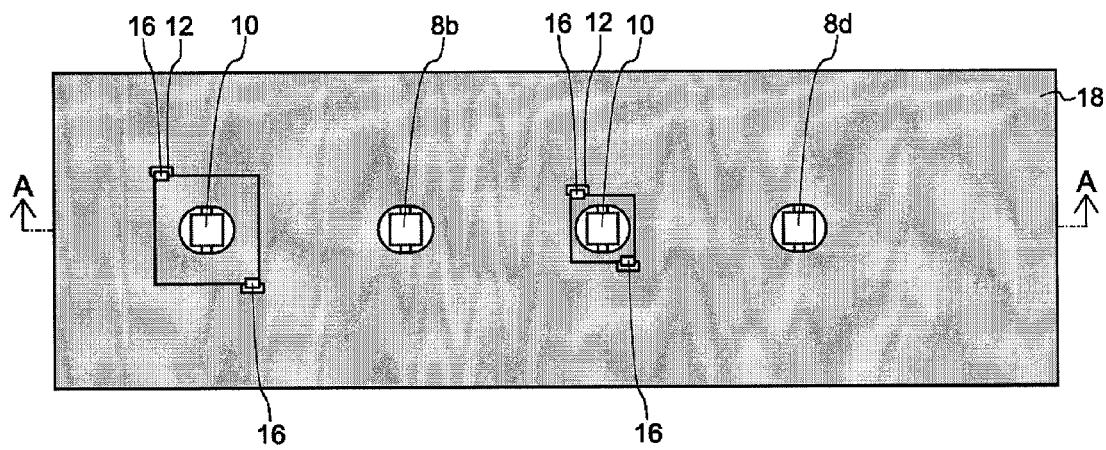
Figure 3J:
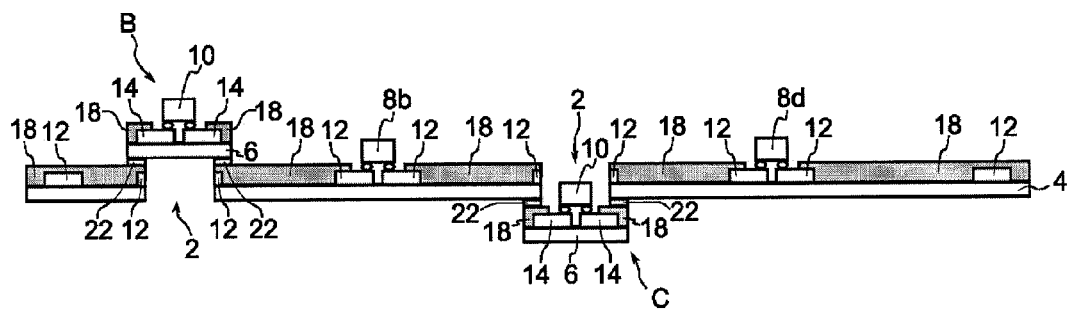

Next, as illustrated in FIGS. 3I and 3J, the second substrates 6, on which the second light-emitting elements 10 are arranged, are attached to the top face (location denoted by reference symbol B in FIG. 3J) or the lower face (location denoted by reference symbol C in FIG. 3J) of the first substrate 4, the through-holes 2 of the first substrate 4 are (e.g., covered), and the second light-emitting elements 10 are electrically connected to the wiring 12 of the first substrate 4. Specifically, the second light-emitting elements 10 are connected to the wiring 14 of the second substrates 6, and then the wiring 14 of the second substrates 6 are electrically connected to the wiring 12 of the first substrate 4 with the connection members 16 (when wiring 12 of the first substrate 4 are connected to the wiring 14 of the second substrates 6, the wiring 12 of the first substrate 4 is exposed by removing a part of the reflective member 18). Herein, the second light-emitting elements 10 are arranged at substantially the same positions as those of the first light-emitting elements 8b, 8d.

In the embodiment, an example has been explained in which the reflective member 18 on the second substrates 6 is provided before attachment of the second substrates 6 to the first substrate 4, but the reflective member 18 on the second substrates 6 may be provided after attachment of the second substrates 6 to the first substrate 4.

In the embodiment, an example has been explained wherein the second substrates 6 are attached to the top face and the lower face of the first substrate 4, but the second substrates 6 may be attached to the top face of the first substrate 4, or may be attached to the lower face of the first substrate 4, or may be attached to top face and the lower face of the first substrate 4.

(Seventh Process Step)

Figure 3K:
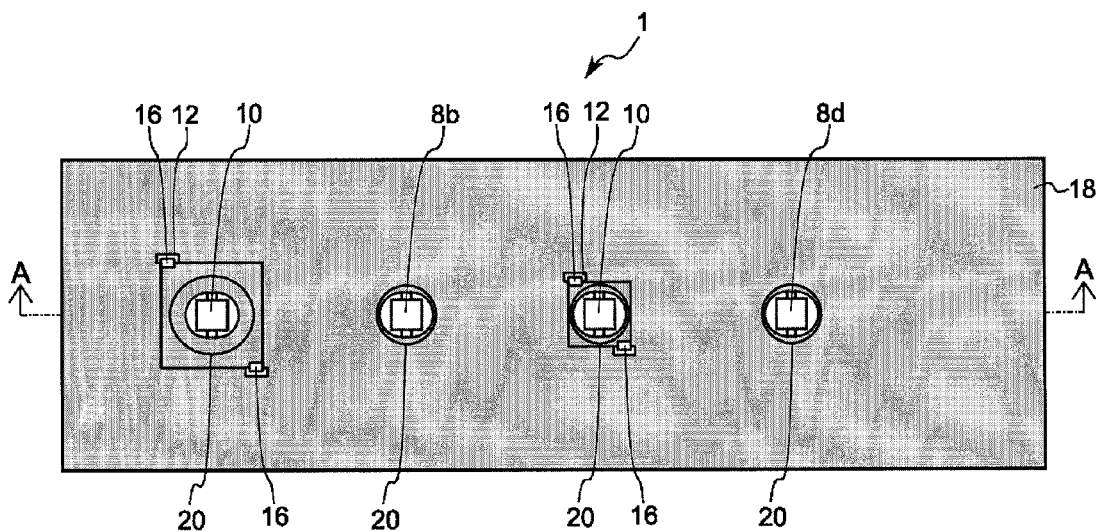
Figure 3L:
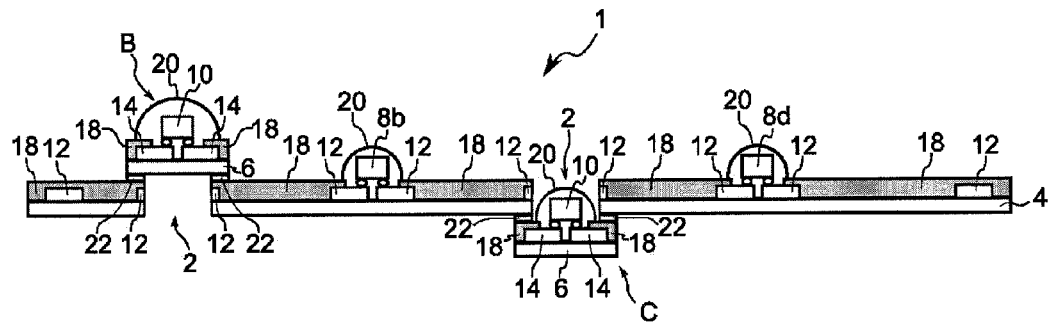

As illustrated in FIGS. 3K and 3L, the first light-emitting elements 8b, 8d and the second light-emitting elements 10 are sealed by respective semi-spherical sealing members 20 that are a light-transmitting silicone resin containing a YAG-based phosphor. The first light-emitting elements 8b, 8d may be sealed at any point in time after the third process step, namely before the fourth process step or before the fifth process step. In this way, defects caused by the sealing members 20 can be removed. The second light-emitting elements 10 may be sealed before attachment of the second substrates 6 to the first substrate 4. In this way, the characteristics of the second light-emitting elements 10 and of the sealing members 20 can be assessed before attachment to the first substrate 4, and hence it becomes possible to prevent the sealing members 20 from causing defects of the second light-emitting elements 10 after attachment to the first substrate 4.

An embodiment has been explained above, but the explanation relates merely to an example of the present invention, which is in no way limited to or by the explanation.

DENOTATION OF REFERENCE NUMERALS 1 light-emitting device
2 through-hole
4 first substrate
4a protruding section
6 second substrate
6a protruding section
8 first light-emitting element
8a first light-emitting element
8b first light-emitting element
8c first light-emitting element
8d first light-emitting element
10 second light-emitting element
12 wiring
14 wiring
16 connection member
18 reflective member
20 sealing member
22 adhesive member

What is claimed is:

1. A light-emitting device, comprising:
   a first substrate including at least one through-hole;
   a plurality of first light-emitting elements that are arranged on the first substrate;
   at least one second substrate that is attached to the first substrate to cover the through-hole in the first substrate; and
   at least one second light-emitting element arranged on the second substrate, and electrically connected to wiring of the first substrate.

2. The light-emitting device according to claim 1, wherein a reflective member is provided on the second substrate.

3. The light-emitting device according to claim 1, wherein the second substrate is attached to a top face of the first substrate.

4. The light-emitting device according to claim 1, wherein the second substrate is attached to a lower face of the first substrate.

5. The light-emitting device according to claim 1, wherein the second substrate is attached to a top face and a lower face of the first substrate.

6. The light-emitting device according to claim 1, wherein the first light-emitting elements and the second light-emitting element are sealed by sealing members respectively.

7. The light-emitting device according to claim 6, wherein the sealing member that seals the second light-emitting element protrudes from the first substrate.

8. The light-emitting device according to claim 1, wherein a plurality of the second light-emitting elements are arranged in accordance with a same arrangement pattern as an arrangement pattern of the first light-emitting elements.

9. The light-emitting device according to claim 1, wherein the second substrate comprises a protruding section in which parts of the second substrate protrude beyond a periphery of a main portion of the second substrate.

10. The light-emitting device according to claim 1, wherein a reflective member that is comprised of a harder resin than a resin of the first substrate is provided on the first substrate.

11. The light-emitting device according to claim 1, wherein the first substrate is flexible.

12. A method for manufacturing a light-emitting device, comprising the steps of:
    arranging a plurality of first light-emitting elements on a first substrate;
    removing a region on the first substrate at which a defective element is arranged, to thereby form a through-hole in the first substrate;
    attaching a second substrate, including at least one second light-emitting element arranged thereon, to the first substrate, to thereby cover the through-hole in the first substrate; and
    electrically connecting the second light-emitting element to wiring of the first substrate.

13. The method for manufacturing a light-emitting device according to claim 12, wherein the removing includes punching.

14. The method for manufacturing a light-emitting device according to claim 12, wherein a reflective member is provided on the first substrate before the removing, and a region on the first substrate is punched with the reflective member.

15. The method for manufacturing a light-emitting device according to claim 12, wherein a reflective member is provided on the first substrate and/or the second substrate after attachment of the second substrate to the first substrate.

16. The method for manufacturing a light-emitting device according to claim 12, wherein the second substrate is attached to a top face of the first substrate.

17. The method for manufacturing a light-emitting device according to claim 12, wherein the second substrate is attached to a lower face of the first substrate.

18. The method for manufacturing a light-emitting device according to claim 12, wherein the second substrate is attached to a top face and a lower face of the first substrate.

* * * * *